(12) United States Patent
Peterson et al.

(10) Patent No.: US 8,199,033 B2
(45) Date of Patent: Jun. 12, 2012

(54) HAPTIC KEYBOARD SYSTEMS AND METHODS

(75) Inventors: Cody George Peterson, Coeur d'Alene, ID (US); Andrew Parris Huska, Post Falls, ID (US); James William Schlosser, Spokane, WA (US)

(73) Assignee: Pacinian Corporation, Spokane, WA (US)

( * ) Notice: Subject to any disclaimer, the term of this patent is extended or adjusted under 35 U.S.C. 154(b) by 214 days.

(21) Appl. No.: 12/360,316

(22) Filed: Jan. 27, 2009

(65) Prior Publication Data

US 2009/0189790 A1 Jul. 30, 2009

Related U.S. Application Data

(63) Continuation-in-part of application No. 11/945,879, filed on Nov. 27, 2007, now Pat. No. 7,741,979.

(60) Provisional application No. 61/024,421, filed on Jan. 29, 2008, provisional application No. 60/948,377, filed on Jul. 6, 2007.

(51) Int. Cl.
  *H03M 11/00* (2006.01)
(52) U.S. Cl. ............... 341/27; 345/156; 84/615; 84/653
(58) Field of Classification Search .......... 84/615, 84/653; 341/22–34; 345/156, 157
See application file for complete search history.

(56) References Cited

U.S. PATENT DOCUMENTS

| 4,200,778 A | 4/1980 | Bovio et al. |
| 4,529,849 A | 7/1985 | Kamei et al. |
| 5,057,657 A | 10/1991 | Skulic |
| 5,239,152 A | 8/1993 | Caldwell et al. |
| 5,612,692 A | 3/1997 | Dugas et al. |
| 5,676,476 A | 10/1997 | Uke |
| 5,729,222 A | 3/1998 | Iggulden et al. |
| 5,943,233 A | 8/1999 | Ebina et al. |
| 6,003,390 A | 12/1999 | Cousy |
| 6,218,966 B1 | 4/2001 | Goodwin et al. |
| 6,684,166 B2 | 1/2004 | Bellwood et al. |
| 6,791,480 B1 | 9/2004 | Uke |
| 7,166,795 B2 | 1/2007 | Lengeling |
| 7,182,691 B1 | 2/2007 | Schena |
| 7,196,688 B2 | 3/2007 | Schena |
| 7,339,572 B2 | 3/2008 | Schena |

(Continued)

FOREIGN PATENT DOCUMENTS

DE 19704253 8/1998

(Continued)

OTHER PUBLICATIONS

"PCT Search Report", Application Serial No. PCT/US2009/032292,(Aug. 11, 2009, 17 pages.

(Continued)

*Primary Examiner* — David S. Warren

(57) ABSTRACT

Various embodiments provide keyboards that utilize electrically-deformable material as an actuating mechanism to provide haptic feedback to a user of the keyboard. In at least some embodiments, the electrically-deformable material is utilized to impart, to a depressed key or keyboard element, a multi-vectored movement that produces a perceived acceleration of the key or keyboard element thus providing a user with haptic feedback which simulates a snapover movement. In at least some embodiments, a light source can be mounted or otherwise positioned relatively close to and beneath the top surface of one or more keys or keyboard elements to backlight a portion or portions of a keyboard.

20 Claims, 11 Drawing Sheets

U.S. PATENT DOCUMENTS

| | | | |
|---|---|---|---|
| 7,342,573 | B2 | 3/2008 | Ryynaenen |
| 7,741,979 | B2 | 6/2010 | Schlosser et al. |
| 7,834,857 | B2 * | 11/2010 | Prados .......................... 345/173 |
| 2002/0054060 | A1 | 5/2002 | Schena |
| 2002/0149561 | A1 | 10/2002 | Fukumoto et al. |
| 2003/0208324 | A1 | 11/2003 | Bellwood et al. |
| 2003/0209131 | A1 | 11/2003 | Asahi |
| 2004/0031673 | A1 | 2/2004 | Levy |
| 2004/0085716 | A1 | 5/2004 | Uke |
| 2004/0130526 | A1 | 7/2004 | Rosenberg |
| 2004/0252104 | A1 | 12/2004 | Nakamura et al. |
| 2005/0017947 | A1 | 1/2005 | Shahoian et al. |
| 2005/0157893 | A1 | 7/2005 | Pelrine et al. |
| 2005/0204906 | A1 | 9/2005 | Lengeling |
| 2005/0237309 | A1 | 10/2005 | Sharma |
| 2006/0256075 | A1 | 11/2006 | Anastas et al. |
| 2006/0261983 | A1 | 11/2006 | Griffin et al. |
| 2006/0267949 | A1 | 11/2006 | Rosenberg |
| 2007/0091070 | A1 | 4/2007 | Larsen et al. |
| 2007/0146317 | A1 | 6/2007 | Schena |
| 2007/0152974 | A1 | 7/2007 | Kim et al. |
| 2007/0193436 | A1 | 8/2007 | Chu |
| 2007/0203011 | A1 * | 8/2007 | Gudgel et al. ..................... 501/2 |
| 2007/0234887 | A1 | 10/2007 | Sawada et al. |
| 2007/0234890 | A1 | 10/2007 | Yamashita |
| 2007/0236449 | A1 | 10/2007 | Lacroix |
| 2007/0236450 | A1 * | 10/2007 | Colgate et al. ................ 345/156 |
| 2007/0251810 | A1 | 11/2007 | Corcoran et al. |
| 2007/0285284 | A1 | 12/2007 | Matteo et al. |
| 2008/0010593 | A1 | 1/2008 | Uusitalo et al. |
| 2008/0042978 | A1 | 2/2008 | Perez-Noguera |
| 2008/0060856 | A1 * | 3/2008 | Shahoian et al. .......... 178/18.03 |
| 2008/0062144 | A1 * | 3/2008 | Shahoian et al. ............. 345/173 |
| 2008/0062145 | A1 * | 3/2008 | Shahoian et al. ............. 345/173 |
| 2008/0083314 | A1 | 4/2008 | Hiyashi et al. |
| 2008/0084384 | A1 | 4/2008 | Gregorio et al. |
| 2008/0092720 | A1 | 4/2008 | Yamashita et al. |
| 2008/0198139 | A1 * | 8/2008 | Lacroix et al. ................ 345/173 |
| 2008/0223706 | A1 | 9/2008 | Hagiwara et al. |
| 2008/0251364 | A1 | 10/2008 | Takala et al. |
| 2008/0289952 | A1 | 11/2008 | Pelrine et al. |
| 2008/0303782 | A1 | 12/2008 | Grant et al. |
| 2009/0002199 | A1 | 1/2009 | Lainonen et al. |
| 2009/0002205 | A1 | 1/2009 | Klinghult et al. |
| 2009/0008234 | A1 | 1/2009 | Tolbert et al. |
| 2009/0085878 | A1 * | 4/2009 | Heubel et al. ................. 345/173 |
| 2009/0085882 | A1 * | 4/2009 | Grant et al. .................... 345/173 |
| 2009/0106655 | A1 * | 4/2009 | Grant et al. .................... 715/702 |
| 2009/0135142 | A1 * | 5/2009 | Fu et al. ......................... 345/168 |
| 2009/0160763 | A1 * | 6/2009 | Cauwels et al. ............... 345/156 |
| 2009/0167704 | A1 * | 7/2009 | Terlizzi et al. ................ 345/173 |
| 2009/0174672 | A1 * | 7/2009 | Schmidt ......................... 345/173 |
| 2009/0178913 | A1 | 7/2009 | Peterson et al. |
| 2009/0188374 | A1 | 7/2009 | Folkesson |
| 2009/0189873 | A1 | 7/2009 | Peterson |
| 2009/0210568 | A1 | 8/2009 | Peterson et al. |
| 2009/0231113 | A1 | 9/2009 | Olien et al. |
| 2009/0231277 | A1 | 9/2009 | Peterson |
| 2009/0267921 | A1 | 10/2009 | Pryor |
| 2009/0303187 | A1 | 12/2009 | Pallakoff |
| 2010/0045612 | A1 | 2/2010 | Moelne |
| 2010/0108408 | A1 * | 5/2010 | Colgate et al. ............. 178/18.03 |
| 2010/0130280 | A1 * | 5/2010 | Arezina et al. .................. 463/20 |
| 2010/0160016 | A1 * | 6/2010 | Shimabukuro et al. ......... 463/16 |
| 2010/0171715 | A1 | 7/2010 | Peterson et al. |
| 2010/0177050 | A1 | 7/2010 | Heubel et al. |
| 2011/0073454 | A1 | 3/2011 | Chen et al. |
| 2011/0227763 | A1 | 9/2011 | Schlosser et al. |

FOREIGN PATENT DOCUMENTS

| | | |
|---|---|---|
| DE | 10126670 | 12/2002 |
| EP | 0654727 | 5/1995 |
| EP | 1310860 | 5/2003 |
| JP | 361000825 A * | 1/1986 |
| WO | WO-0191100 | 11/2001 |
| WO | WO-2009097358 | 8/2009 |
| WO | WO-2009097359 | 8/2009 |
| WO | WO-2009097361 | 8/2009 |
| WO | WO-2009114827 | 9/2009 |

OTHER PUBLICATIONS

"PCT Search Report", Application No. PCT/US2009/032289, (Dec. 23, 2009), 13 pages.

"Tactile Perception and Design", Retrieved from <http:///www.tireesias.org/reports/tpd2.htm>, 10 pages.

"Haptics: Learning Through Touch", Retrieved from <http://ced.ncsu.edu/nanoscale/haptics.htm>, (2004),5 pages.

Bark, Karlin "Functional Prototype I", Retrieved from <http://bdml.stanford.edu/twiki/bin/view/Haptics/FunctionalPrototypeI?skin=print pattern>, (Aug. 9, 2005),3 pages.

"Touch-Hapsys", Retrieved from <http://www.touch-hapsys.org>, 2 pages.

Pasquero, Jerome "Stimulation Of The Fingertip By Lateral Skin Strech", Retrieved from <http://www.cim.mcgill.ca/~jay/index_files/research.htm>, 5 pages.

Wing, Alan et al., "Multidimensional Haptics Preliminary Report", Retrieved from <http://www.touch-hapsys.org>, (Sep. 21, 2003),pp. 1-125.

Wu, Xingtao et al., "A generalized Capacitance-Based Model For Electrostatic Micro-Actuators", Department of Physics, New Jersey Institute of Technology, Newark, NJ, 07102-1982 Department of Mechanical Engineering, Columbia University, NY 10027,pp. 1-23.

Jones, Gail et al., "A Comparison of Learning with Haptic and Visual Modalities", National Science Foundation REC- 0087389,pp. 1-20.

Kajimoto, Hiroyuki et al., "Electro-Tactile Display with Tactile Primary Color Approach", Graduate School of Information and Technology, The University of Tokyo,2 pages.

Gorinevsky, Dimitry "Adaptive membrane for large lightweight space telescopes", SPIE Astronomical Telescopes and Instrumentation,(2002),pp. 1-9.

Odell, D.L. et al., "MicroRobot Convveyance and Propulsion System Using Comb Drive and Parallel Plate Actuators: The ScuttleBot", UC Berkley,4 pages.

Zou, Jun et al., "Design of a Wide Tuning Range Micromachined Tunable Capacitor for Wireless Communications", Micro Actuators, Sensors, and Systems (MASS) Group Microelectronics Laboratory, University of Illinois, Urbana, IL 61801,6 pages.

Pasquero, Jerome "Stress: A Tactile Display Using Lateral Skin Stretch", Department of Electrical and Computer Engineering McGill University, Montreal,(Oct. 2003),75 pages.

Jones, Lynette "Human Factors and Haptic Interfaces", Department of Mechanical Engineering, Massachusetts Institute of Technology,40 pages.

Yang, Gi-Hun "Novel Haptic Mouse System for Holistic Haptic Display and Potential of Vibrotactile Stimulation", Human-Robot Interaction Reserach Center Korea Advanced Institute of Science and Technology,17 pages.

Hollis, Ralph "Haptics", *Bershire Encyclpedia of Human-Computer Interaction*, Berkshire Publishing Group,(2004),pp. 311-316.

"Proposed Experiment Protocol and Details", Retrieved from <http://bdml.stanford.edu/twiki/bin/view/Haptics/ProposedExperi0mentProtocolAndDetails>, 5 pages.

Mok Ha, Soon et al., "Interpenetrating Polymern Networks for High-Performance Electroelastomer Artificial Muscles", Department of Materials Science and Engineering, UCLA,pp. 1-19.

Beavers, Alex "Basic Concepts for Commercial Applications of Electroactive Polymer Artificial Muscle", Artificial Muscle Incorporated, Menlo Park, CA,10 pages.

Ashley, Steven "Artificial Muscles", *Scientific American*, Availallbe at<www.sciam.com>,(Oct. 2003),pp. 53-59.

Pasquero, Jerome "Tactile Display Survey", Technical Report TR-CIM 06.04,6 pages.

"Haptic Touch Technology", Pacinian,(Nov. 2007),2 pages.

Bar-Cohen, Yoseph "Electroactive Polymers", Retrieved from<http://electrochem.cwru.edu/ed/encycl/>, Electrochemistry Encyclopedia,(Dec. 2004),7 pages.

Fontaine, Ebraheem "A Laboratory Demonstration of a Parallel Robotic Mechanism", Massachusetts Institue of Technology,(Jun. 2002),pp. 1-14.

"Elastomers: Powerful Polymer", Retrieved from<http://appliancedesign.com/copyright/>, (Jun. 2006),5 pages.

Bar-Cohen, Yoseph "Worldwide Electroactive Polymers", (Artificial Muscles) Newsletter, vol. 7, No. 2, Available at <http://eap.jpl.nasa.gov>,(Dec. 2005),pp. 1-16.

Bifano, Thomas "Parallel Plate Electrostatic Actuation for High-Resolution Deformable Mirrors", Boston University,(Aug. 19, 2004),35 pages.

Pasquero, Jerome "Survey on Communication Through Touch", *Technical Report: TR-CIM 06.04*, Center for Intelligent Machines Department of Electrical and Computer Engineering,(Jul. 2006),pp. 1-27.

"Touch And Haptics", *2004 IEEE/ RSJ International Conference on Intelligent Robots and Systems*, (Sep. 28, 2004),32 pages.

O'Halloran, A et al., "Materials and Technologies For Artificial Muscle: A Review for the Mechatronic Muscle Project", *Topics in Bio-Mechanical Engineering, Chapter 7*, Department of Electronic Engineering, National University of Ireland Galway,(2004),pp. 184-215.

Biggs, James "Some Useful Information for Tacttile Display Design", *IEEE Transactions on Man-Machine Systems*, vol. 11, No. 1,(1970),pp. 19-24.

Raisamo, Roope "Tactile User Interfaces", New Interaction Techniques,(Aug. 2, 2001),30 pages.

Bar-Cohen, Yoseph "Low Mass Muscle Actuators (LoMMAs)", Telerobotic Task Sponsered by NASA HQ, Code S,(Oct. 23, 1997),18 pages.

"Role of Skin Biomechanics in Mechanoreceptor", Retrieved from <http://touchlab.mit.edu/oldresearch/currentwork/humanhaptics/roleofskinbiomechanics/> on Dec. 20, 2007, MIT Touch Lab,(Dec. 20, 2007),pp. 1-13.

Spires, Shelby "Artificial Strongman", *Smart Business: For The New Economy*, (Nov. 2000),1 page.

Sommer-Larsen, Peter "Artificial Muscles", Rise National Laboratory, Condensed Matter Physics and Chemistry Department,3 pages.

Bar-Cohen, Yoseph "Electric Flex", *IEEE Spectrum Online*, (Jun. 2004),6 pages.

Bar-Cohen, Yoseph "Electroactive Polymers as Artificial Muscles-Capabilities, Potentials and Challenges", *Robotics 2000*, Available at <www.spaceandrobotics>,(Feb. 28, 2003/Mar. 2, 2000),pp. 1-8.

Carpi, Federico et al., "Dielectric Elastomers as Electromechanical Transducers: Fundamentals, Materials, Devices, Models and Applications of an Emerging Elecrotactive Polymer Technology", Elsevier LTD., (2008),12 pages.

"Non final OA", U.S. Appl. No. 11/945,879, (Feb. 13. 2009).

Hayward, Vincent et al., "Tactile Display Device Using Distributed Lateral Skin Stretch", *Proceedings of the Haptic Interfaces for Virtual Environment and Teleoperator Systems Symposium*, ASME International Mechanical Engineering Congress & Exposition,(2000),pp. 1309-1314.

Seeger, Joseph et al., "Dynamics and Control of Parallel-Plate Actuators Beyond the Electrostatic Instability", *Transducers "99 the 10th Interrnational Conference on Solid State Sensors and Actuators*, (Jun. 1999),pp. 474-477.

"Nanoactuators Based on Electrostatic Forces on Dieletrics", Retrieved from<http://www.nasatech.com/Briefs/Apr05/NPO30747.html> on Nov. 28, 2005, NASA'sJet Propulsion Laboratory, Pasadena, CA,4 pages.

Bar-Cohen, Yoseph et al., "Enabling Novel Planetary and Terrestrial Mechanisms Using Electroactive Materials at the JPL's NDEAA Lab", Retrieved from http://ndeaa.jpl.nasa.gov>, pp. 1-6.

Pei, Qibing et al., "Multiple-Degrees-of-Freedom Electroelastomer Roll Actuators", *SRI International Institute of Physics Publishing*, (2004),pp. N86-N92.

"New SRI International sSpin-Off, Artificial Muscle, Inc., Secure Series a Funding from Leading VC Firms", Retrieved from <http://www.sri.com/news/releases/05-03-04.html> on Jan. 30, 2008, SRI International Spin Offs Artificial Muscle, Inc,(May 2004),2 pages.

Jager, Edwin et al., "Microfabricating Conjugated Polymer Actuators",*Science Magazine*, vol. 290, www.sciencemag.org,(Nov. 24, 2000),pp. 1540-1544.

Wingert, Andreas et al., "On the Kinematics of Parallel Mechanisms with Bio-stable Polymer Actuators", Department of Mechanical Engineering, Massachussetts Institute of Technology Cambridge,8 pages.

"Non Final Office Action", U.S. Appl. No. 11/945,879, (Feb. 13, 2009),8 pages.

Bicchi, Antonio et al., "Haptic Illusions Induced by the Tactile Flow", Interdepartmental Research Centre "E. Piaggo", University of Pisa,16 pages.

Wagner, Christopher et al., "Integrating Tactile and Force Feedback with Finite Element Models", Division of Engineering and Applied Sciences, Harvard University,6 pages.

Bar-Cohen, Y. "Electroactive Polymer (EAP) Actuators as Artificial Muscles—Reality, Potential and Challenges", *SPIE Press*, (Mar. 18, 2004),pp. 26 and 548-550.

Van De Mortel, Dirk "Exploration of Smart Materials for the Use of User-System Interaction", *User System Interaction. Faculty Industrial Design. TU/e.*(Apr. 2002),pp. 21-24.

"Notice of Allowance", U.S. Appl. No. 11/945,879, (Feb. 23, 2010),6 pages.

"PCT Search Report and Written Opinion", Application No. PCT/US2010/020380, (Apr. 12, 2010), 13 pages.

"Supplemental Notice of Allowance", U.S. Appl. No. 11/945,879, (May 20, 2010),5 pages.

"Final Office Action mailed Nov. 8, 2011", U.S. Appl. No. 12/360,265, 11 pages.

"Final Office Action mailed Nov. 22, 2011", U.S. Appl. No. 12/371,301, 6 pages.

"Non-Final Office Action mailed Oct. 13, 2011", U.S. Appl. No. 12/791,630, 5 pages.

"Non-Final Office Action mailed Feb. 13, 2009", U.S. Appl. No. 11/945,879, 7 pages.

"Non-Final Office Action mailed Apr. 1, 2011", U.S. Appl. No. 12/371,301, 4 pages.

"Non-Final Office Action mailed May 12, 2011", U.S. Appl. No. 12/360,265, 7 pages.

"Non-Final Office Action mailed Jul. 9, 2009", U.S. Appl. No. 11/945,879, 10 pages.

"Non-Final Office Action mailed Sep. 1, 2011", U.S. Appl. No. 12/403,270, 5 pages.

"Notice of Allowance and Fees Due" mailed Feb. 21, 2012, U.S. Appl. No. 12/403,270, 5 pages.

* cited by examiner

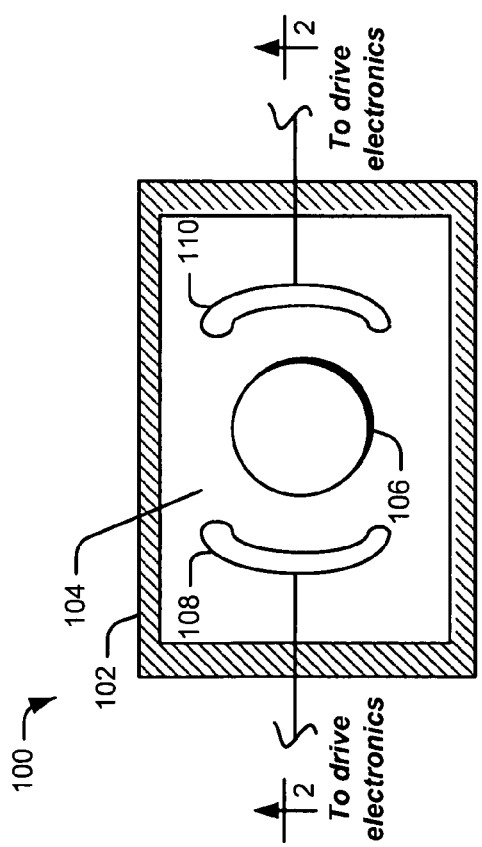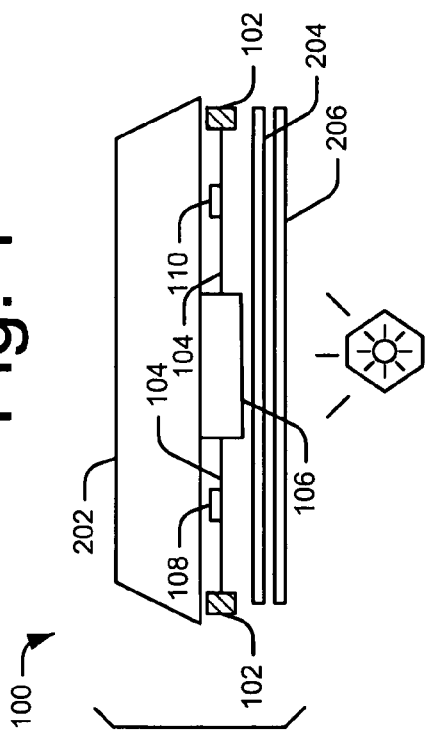

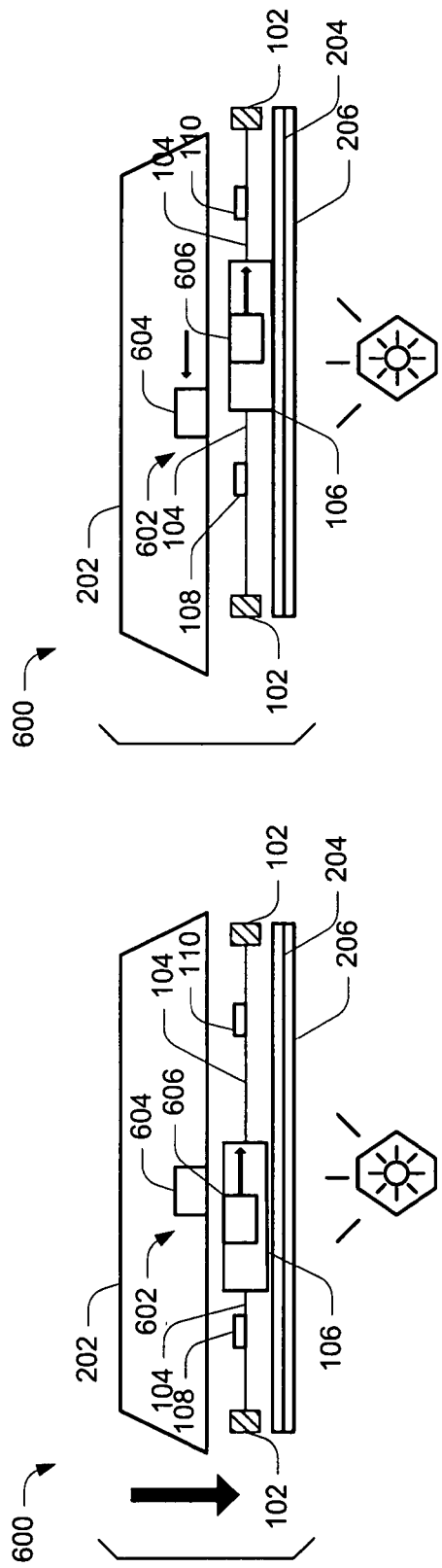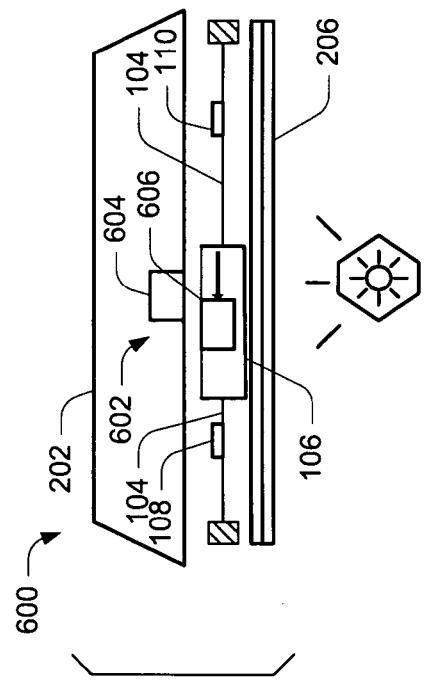
Fig. 7
Fig. 6
Fig. 8

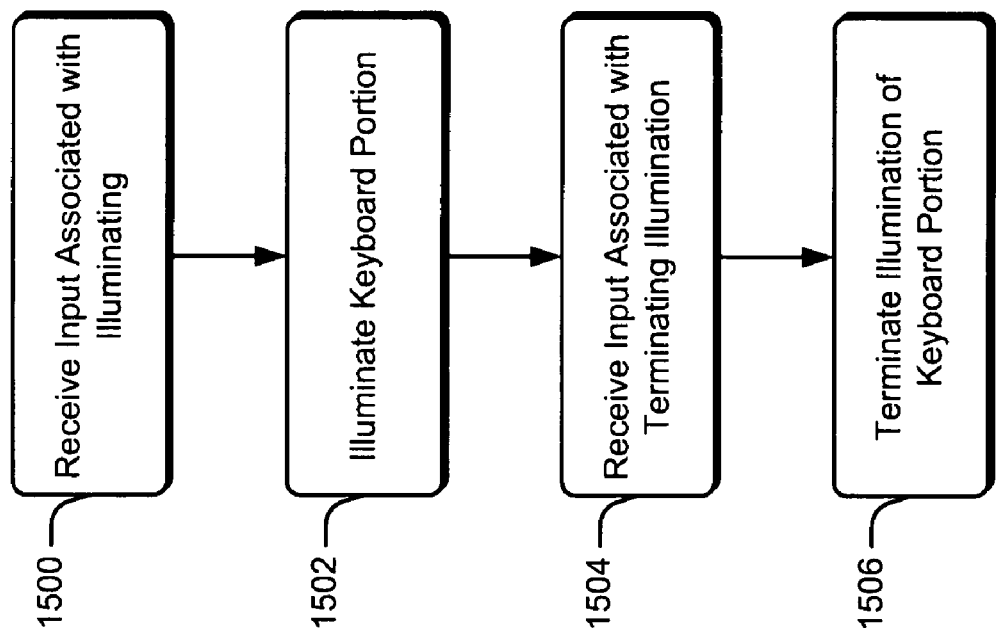

HAPTIC KEYBOARD SYSTEMS AND METHODS

RELATED APPLICATIONS

This application claims priority to U.S. Provisional Application No. 61/024,421, filed on Jan. 29, 2008, the disclosure of which is incorporated by reference herein in its entirety. This application is a continuation-in-part of and claims priority to U.S. application Ser. No. 11/945,879 filed on Nov. 27, 2007 now U.S. Pat. No. 7,741,979, which in turn claims priority to U.S. Provisional Application No. 60/948,377 filed on Jul. 6, 2007, the disclosures of which are incorporated by reference herein in their entirety.

BACKGROUND

Today, rapid typing keyboard technologies typically embody three primary attributes that are viewed as necessary or desirable for an effective implementation-low actuation force, significant travel distance, and tactile "snapover".

With regard to a low actuation force, studies have found that in order for a user to rapidly type, it is desirable to provide an overall key top actuation force from around between 40-80 grams. Having a light actuation force permits easy actuation and reduces fatigue.

With regard to travel distance, in order to rapidly type, many current technologies provide an overall travel distance (i.e. the vertical distance a key travels) from between 2-4 millimeters. In technologies that implement keyboards using elastomeric domes that are collapsible under pressure for key actuation, the travel distance is required because of the physical and mechanical nature of the domes that are employed. Specifically, the physical structure of the dome requires a longer travel distance in order to allow the dome geometry to adequately collapse, thus providing a response with tactile characteristics that are necessary or desirable for rapid typing. In addition, this travel distance is important because as a key top moves relative to a finger, frictional forces of this relative movement provide an additional tactile element (i.e. localized skin stretching) that plays an important role in a user's recognition of an electronic switch closure. The travel distances required by current dome technology significantly limit the form factor, e.g. the thickness of an associated keyboard. That is, keyboard thickness is significantly limited by the use of dome technology. This, in turn, reduces keyboard construction potentials and the various environments in which such keyboards can be used.

With regard to the tactile snapover, such is an important aspect for rapid typing. A snapover, as will be appreciated by the skilled artisan, creates a specific tactile response which is desirable in typing scenarios, particularly those that are rapid typing scenarios. The notion of snapover refers to a relationship between force and travel and is defined as a specific area on a standard keyboard force displacement curve. Snapover is what users typically associate with a valid electronic switch closure. In addition, this association between the tactile response and an electronic switch closure allows the user to learn to not rely solely on visual confirmation during typing, such as looking at the screen between each typed letter, to ensure that they are typing correctly. In current rubber dome technologies, this snapover is achieved due to the collapsing of the rubber dome. Typically, force exerted on the key and hence, on the rubber dome increases until the dome collapses and achieves switch closure. Due to the geometry and the physical characteristics of the rubber dome, achieving a snapover effect requires a sufficient amount of force and travel to reach the snapover point.

Against the backdrop, a need remains for keyboards that provide adequate user feedback and address the three attributes mentioned above.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Various embodiments provide keyboards that utilize an electrically-deformable material as an actuating mechanism to provide haptic feedback to a user of the keyboard. In at least some embodiments, the electrically-deformable material is utilized to impart, to a depressed key or keyboard element, a multi-vectored movement that produces a perceived acceleration of the key or keyboard element thus providing a user with haptic feedback which simulates a snapover movement.

In at least some embodiments, the electrically-deformable material is driven with a voltage responsive to a user depressing a key or keyboard element. In these embodiments, switch closure is first attained followed by the haptic feedback provided through the multi-vectored movement of the key or keyboard element. In at least some embodiments, the multi-vectored movement moves the key or keyboard element in at least a first direction, and then a second direction which is different from the first. Each of the directional movements is induced by its own driven voltage which is applied to different areas of the electrically-deformable material. In at least some embodiments, one of the directions of movement moves the key or keyboard element a distance which is greater than another of the directions of movement.

In a specific embodiment, a first direction of movement is generally toward the user and a second direction of movement is generally away from the user. In at least some embodiments, the first direction moves the key or keyboard element a distance which is less than a distance that the second direction moves the key or keyboard element. In one embodiment, the first direction moves the key or keyboard element a distance which is about half the distance that the second direction moves the key or keyboard element.

In at least some embodiments, multiple keys or keyboard elements can be grouped together into a logical grouping which is driven in a multi-vectored movement to provide haptic feedback. In this instance, each logical grouping constitutes a plate which is moved under the influence of the electrically-deformable material. In at least some embodiments, a keyboard can have single keys or keyboard elements that are driven under the influence of the electrically-deformable material, as well as logical groupings of keys or keyboard elements that are driven under the influence of the electrically-deformable material.

In at least some embodiments, the electrically-deformable material comprises an electroactive polymer or EAP. Other electrically-deformable materials can, of course, be used.

In at least some embodiments, a light source can be mounted or otherwise positioned relatively close to and beneath the top surface of one or more keys or keyboard elements. As a result, the amount of emitted light that is blocked and/or diffused before reaching and illuminating the top surface is significantly reduced.

In at least some embodiments, a specific portion of a keyboard can be selectively illuminated to achieve a tailored backlighting effect.

In at least some embodiments, an input associated with illuminating a keyboard portion can be received and in response, the keyboard portion can be illuminated. In addition, an input associated with terminating the illumination of the keyboard portion can be received and in response, the illumination of the keyboard portion can be terminated.

BRIEF DESCRIPTION OF THE DRAWINGS

The same numbers are used throughout the drawings to reference like features.

FIG. 1 illustrates a top plan view of example key or keyboard element in accordance with one or more embodiments.

FIG. 2 illustrates the view of the FIG. 1 key or keyboard element, taken along line 2-2 in FIG. 1.

FIG. 6 illustrates a key or keyboard element in accordance with one or more embodiments.

FIG. 7 illustrates a key or keyboard element in accordance with one or more embodiments.

FIG. 8 illustrates a key or keyboard element in accordance with one or more embodiments.

FIG. 15 is a flow diagram that describes steps in a backlighting method in accordance with one or more embodiments.

DETAILED DESCRIPTION

Overview

Figure 3:
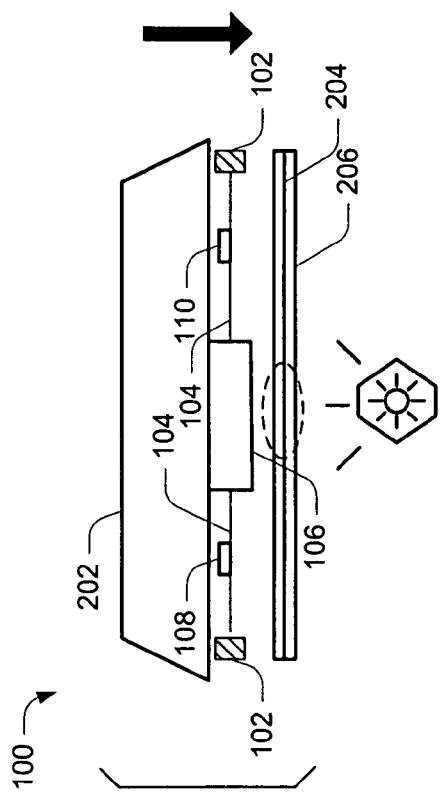
FIG. 3 illustrates a key or keyboard element in accordance with one or more embodiments.

Various embodiments provide keyboards that utilize an electrically-deformable material as an actuating mechanism to provide haptic feedback to a user of the keyboard. Haptic feedback refers to feedback that is provided through movement related to touch.

In at least some embodiments, the electrically-deformable material is utilized to impart, to a depressed key or keyboard element, a multi-vectored movement that produces a perceived acceleration of the key or keyboard element thus providing a user with haptic feedback which simulates a snapover movement.

In at least some embodiments, the electrically-deformable material is driven with a voltage responsive to a user depressing a key or keyboard element. In these embodiments, switch closure is first attained followed by the haptic feedback provided through the multi-vectored movement of the key or keyboard element. In at least some embodiments, the multi-vectored movement moves the key or keyboard element in at least a first direction, and then a second direction which is different from the first. Each of the directional movements is induced by its own driven voltage which is applied to different areas of the electrically-deformable material. In at least some embodiments, one of the directions of movement moves the key or keyboard element a distance which is greater than another of the directions of movement.

In a specific embodiment, a first direction of movement is generally toward the user and a second direction of movement is generally away from the user. In at least one embodiment, the first direction moves the key or keyboard element a distance which is less than a distance that the second direction moves the key or keyboard element. In one embodiment, the first direction moves the key or keyboard element a distance which is about half the distance that the second direction moves the key or keyboard element.

In at least some embodiments, multiple keys or keyboard elements can be grouped together into a logical grouping which is driven in a multi-vectored movement to provide haptic feedback. In this instance, each logical grouping constitutes a plate which is moved under the influence of the electrically-deformable material. In at least some embodiments, a keyboard can have single keys or keyboard elements that are driven under the influence of the electrically-deformable material, as well as logical groupings of keys or keyboard elements that are driven under the influence of the electrically-deformable material.

In at least some embodiments, the electrically-deformable material comprises an electroactive polymer or EAP. Other electrically-deformable materials can, of course, be used.

In at least some embodiments, a light source can be mounted or otherwise positioned relatively close to and beneath the top surface of one or more keys or keyboard elements. As a result, the amount of emitted light that is blocked and/or diffused before reaching and illuminating the top surface is significantly reduced.

In at least some embodiments, a specific portion of a keyboard can be selectively illuminated to achieve a tailored backlighting effect.

In at least some embodiments, an input associated with illuminating a keyboard portion can be received and in response, the keyboard portion can be illuminated. In addition, an input associated with terminating the illumination of the keyboard portion can be received and in response, the illumination of the keyboard portion can be terminated.

In the discussion that follows, a section entitled "Example Key or Keyboard Element" is provided and describes but one example of a key or keyboard element in accordance with one or more embodiments. Following this, a section entitled "Magnetically-Induced Snapover Effect" is provided and describes one example of how snapover effect can be achieved using a magnetic assembly. Following this, a section entitled "Drive Circuit" is provided and describes an example circuit that can be used as drive circuitry. Next, a section entitled "Detent Structure" is provided and describes an example detent structure that can be utilized to provide a snapover effect. A section entitled "Example System" is provided and describes a system that can be used in accordance with one or more embodiments. Next, a section entitled "Logical Key Groupings" is provided and describes how multiple different keys can be grouped together in accordance with one or more embodiments. Next, a section entitled "Example Method" is provided and describes a method in accordance with one or more embodiments. Next, a section entitled "Backlighting" is provided and describes how a more satisfactory and efficient top surface backlighting effect can be achieved in accordance with one or more of the described embodiments. Next, a section entitled "Selective Backlighting" is provided and describes how a specific keyboard portion can be selectively illuminated by an underlying light source. Finally, a section entitled "Example Backlighting Method" is provided and describes a method in accordance with one or more embodiments.

Example Key or Keyboard Element

FIG. 1 illustrates an example key or keyboard element in accordance with one or more embodiments generally at 100. In this example, the key or keyboard element includes a frame 102 to which is mounted or otherwise connected to one or more sections of electrically-deformable material 104. Frame 102 is supported by an overall housing an example of which is provided below in FIG. 11. In the illustrative example, electrically-deformable material 104 comprises a single integral piece of material. It is to be appreciated and understood, however, that individual keys or keyboard elements can have multiple different sections of electrically-deformable material.

In at least some embodiments, the electrically-deformable material comprises an electro-active polymer or EAP. EAP refers to a class of polymers which are formulated to exhibit different physical, electrical, and/or electro-optical behaviors and properties. In general, when EAP is driven by an applied voltage, the EAP undergoes a deformation in a particular direction. This deformation causes the EAP to move in the particular direction. In this particular embodiment, the electrically-deformable material 104 is driven by one or more drive voltages to effect movement of an associated key or keyboard element. To this end, and in this embodiment, key or keyboard element 100 includes a center actuator 106 which is mounted to or otherwise joined with electrically-deformable material 104. Actuator 106, in turn, is fixedly connected to an associated key or keyboard element (not shown) which lies above the plane of the page upon which FIG. 1 appears.

Key or keyboard element 100 also includes one or more electrical contacts which are used to apply a drive voltage to electrically-deformable material 104. In the illustrated and described embodiment, first and second electrical contacts 108, 110 are provided and are in electrical communication with the electrically-deformable material 104. In turn, the first and second electrical contacts 108, 110 are connected with drive electronics which are used to apply a voltage to the contact and hence, cause deformation of the electrically-deformable material 104. Any suitable material can be used for contacts 108, 110. In the illustrated and described embodiment, the electrical contacts comprise a carbon material which is mounted to or otherwise joined with the electrically-deformable material.

FIG. 2 illustrates key or keyboard element 100 of FIG. 1 in a view that is taken along line 2-2 in FIG. 1. Like numerals from the FIG. 1 illustration have been utilized to depict like components. Here, the key or keyboard element 100 includes a user-engageable portion 202 which is the portion that is typically depressed by the user. The user-engageable portion may, for example, correspond to a particular key, such as the letter "A" key, a function key, a shift key, and the like. The user-engagable portion includes a surface—here a top surface—that is typically engaged by a user's finger.

In addition, key or keyboard element 100 includes a pair of switch closure elements 204, 206 forming a switch. The switch closure elements can be formed from any suitable material examples of which include non-tactile membranes that include electrically conductive materials. Other materials include, by way of example and not limitation, conductive elastomeric material, carbon material, piezo-membrane, capacitive sensing, capacitive sensing in combination with piezo sensing and piezo ink, to name just a few. In addition, the switch closure elements can be located at any suitable location within the keyboard element. For example, the switch closure elements can be located between portion 202 and underlying structure, on top of portion 202, or any other suitable location. The switch closure elements are connected to circuitry to detect switch closure.

In addition, in at least some embodiments, backlighting can be provided by virtue of one or more light sources mounted underneath the key or keyboard element. The light sources can be implemented using any suitable technology. By way of example and not limitation, light sources can be implemented using LEDs, light pipes using LEDs, fiber optic mats, and/or electroluminescent panels to name just a few.

In at least some embodiments, the electrically-deformable material is generally translucent, thus allowing light to pass through and illuminate the undersides of the keys. This can allow, for example, key legends to be illuminated for the user. In the past, backlighting keyboards has proven difficult due to the presence of various actuation structures such as domes and scissor mechanisms which tend to block light.

Referring to FIG. 3, when a user depresses key or keyboard element 100 in the direction shown, switch closure elements 204, 206 are brought into electrical communication (as indicated by the dashed oval) which closes a circuit thus indicating that a key or keyboard element has been depressed. Circuitry described below detects the depression event and causes drive electronics to apply one or more drive voltages (e.g., 500-5000) volts to the electrically-deformable material 104. The drive electronics can be configured in any suitable way. For example, in some embodiments, the drive circuitry can include switching circuitry that switches a low voltage side of a power supply on or off using, for example, one power supply per key or keyboard element. Inductive transformers or piezoelectric transformers can be used to generate sufficient voltage supplies, as will be appreciated by the skilled artisan. Alternately or additionally, various solid state devices can be used to switch power from a single voltage supply to individual EAP portions as required. One specific example of a circuit suitable for use is shown and described below in a section entitled "Drive Circuit". Alternately or additionally, switching can be achieved using an application specific integrated circuit (ASIC) that contains a series array of solid state switch elements.

When the drive voltages are applied to the electrically-deformable material, multi-vectored movement is imparted to actuator 106 and hence, to portion 202.

Figure 5:
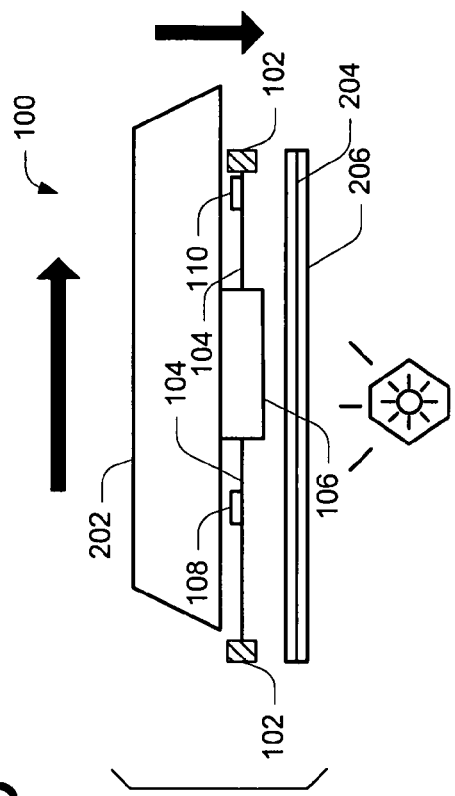
FIG. 5 illustrates a key or keyboard element in accordance with one or more embodiments.
Figure 4:
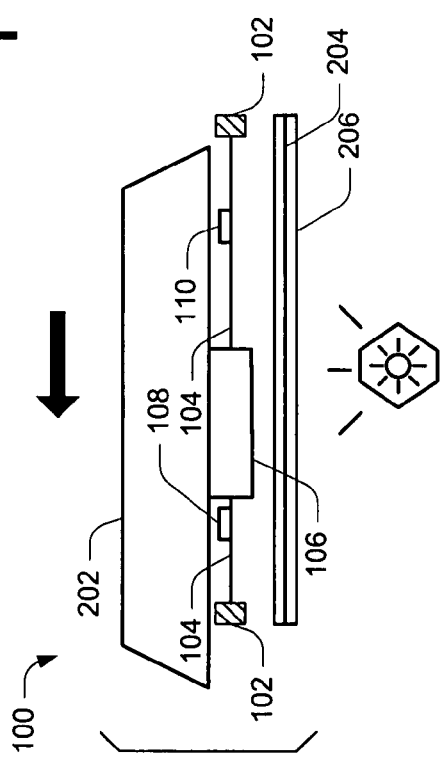
FIG. 4 illustrates a key or keyboard element in accordance with one or more embodiments.

Specifically, and as perhaps best shown in FIGS. 4 and 5, when a user depresses a key or a keyboard element sufficient to effect switch closure, the drive electronics drive the electrically-deformable material and hence, the key or keyboard element in a first direction which, in this example, is generally toward the user. In this example, the drive voltage is applied through electrical contact 110. Subsequently, the drive electronics, through electrical contact 108, drive the electrically-deformable material in a second, different direction. In this example, the second, different direction is generally away from the user. In at least some embodiments, the first direction moves actuator 106 a first distance and a second direction moves actuator 106 a second distance which is greater than the first distance. In at least some embodiments, the first distance is about half the distance of the second distance. In at least some embodiments, the first distance is about ½ millimeter and a second distance is about 1 mm.

The electrically-deformable material can, however, be operated in a "single phase" mode or a "dual phase" mode. In a single phase mode, when the material is electrically driven, the material moves the key or keyboard element in a desired direction. When the drive voltage is removed, the material returns to its original, starting position due to the resiliency of the material. In a dual phase mode, the material is driven as described above. Of course, multiple other phases can be used by driving the material to impart to it movements other than the "back and forth" movement described above.

Magnetically-Induced Snapover Effect

In at least some embodiments, movement of the key or keyboard element to provide a snapover effect is provided through a combination of the electrically-deformable material and a magnetic assembly comprising, in this example, a pair of opposed magnets that are mounted in the key or keyboard element structure.

As an example, consider FIG. 6. There, a key or keyboard element is shown generally at 600. Like numerals from the above-described embodiments are utilized to depict like components. Here, a magnet assembly 602 includes a first magnet 604 and a second magnet 606. First magnet 604 is seated or otherwise fixedly mounted to user-engageable portion 202. Second magnet 606 is mounted to electrically-deformable material 104. When a user depresses a key or keyboard element, a drive voltage is applied to the electrically-deformable material 104 sufficient to cause second magnet 606 to move in the direction indicated. In this example, the drive voltage is applied first by electrical contact 108. As the second magnet 606 moves in the indicated direction, the interaction of the magnetic fields of magnets 604, 606 causes magnet 604 to be driven in an opposite direction as indicated in FIG. 7. As first magnet 604 is driven under the influence of the magnets' magnetic fields, user engageable portion 202 is moved in a first direction, as shown in FIG. 7. A second drive voltage is then applied by electrical contact 110 to cause second magnet 606 to be moved in the opposite direction as shown in FIG. 8. Again, this causes the magnetic fields of the magnet assembly to interact with one another and move the key or keyboard element back to what can be considered a starting location or equilibrium point.

Drive Circuit

Figure 8A:
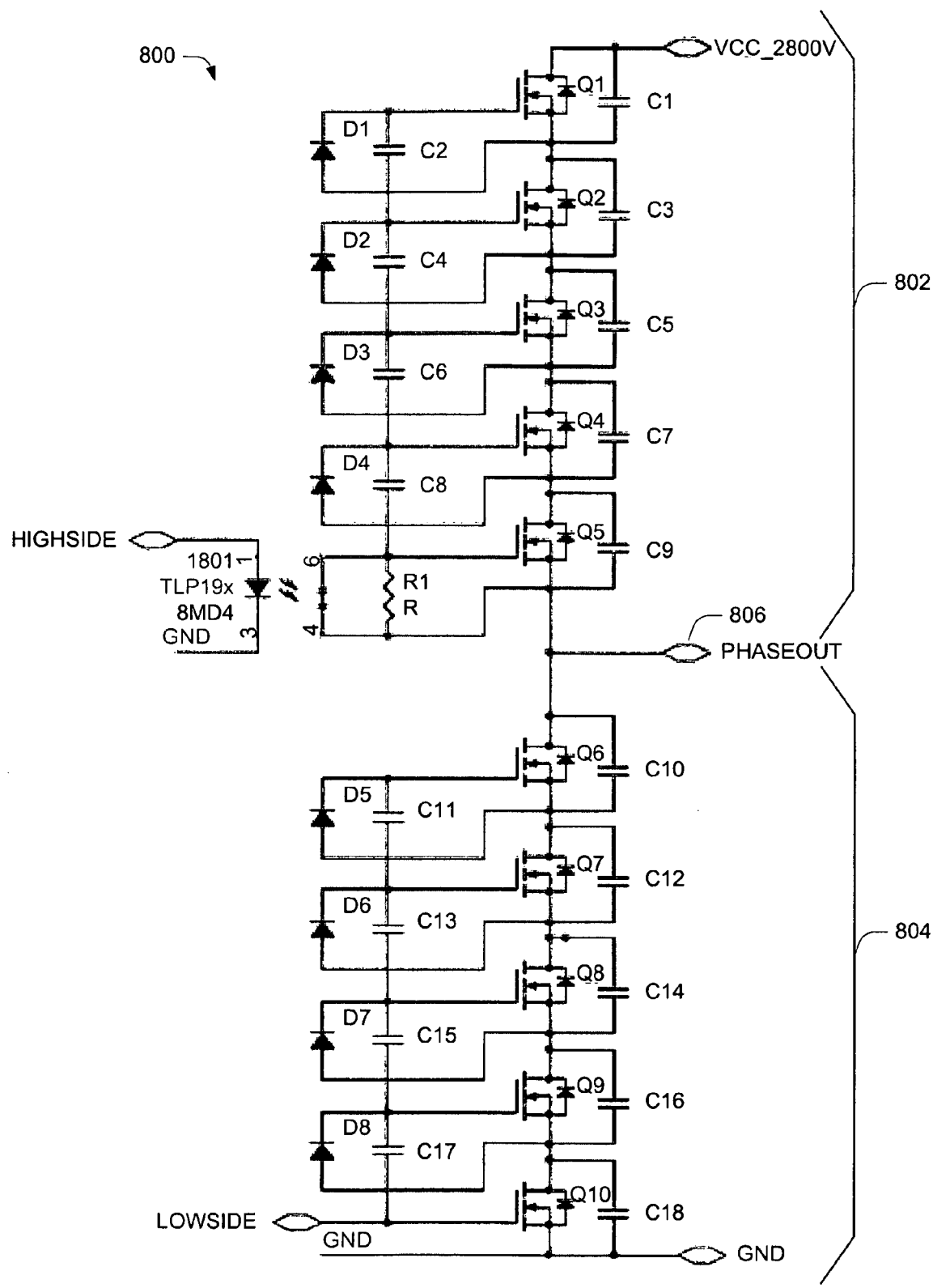
FIG. 8a is a circuit diagram in accordance with one or more embodiments.

FIG. 8a illustrates an example drive circuit in accordance with one embodiment, generally at 800. Here, there is a high side stack 802 and a low side stack 804. A supply voltage is connected across the stacks to ground. A phaseout node 806 is provided between the high side stack 802 and the low side stack 804.

Individual stacks are defined by collections of series-connected field effect transistors (FETs) individual ones of which are connected in parallel with a capacitive element or capacitor as shown. The parallel-connected capacitors reduce static power consumption. During a switching transient, the parallel capacitors equally share the voltage drop across the stack so that the sharing is even at the end of the dynamic mode.

Since there is no static current draw, there is no charge depletion to offset the balance. Of course there is always leakage in the capacitors and capacitive actuator that would be considered static current draw, but the FETs themselves have enough drain-source leakage that the leakage of the capacitors and load are offset and the system remains stable with a fast response. The leakage of the FETs is enough to maintain the static voltage sharing but since it is on the order of nanoamps there is an acceptable level of power dissipation, even for many stacks of devices in parallel.

As a design consideration, when driving capacitive loads, the dynamic load balancing is affected by the load charging time constant, causing the FET nearest the output to carry too little voltage which can make the other FETS fail due to exceeding their drain-source voltage rating when operating at high voltages close to the maximum rating of the stack. This happens as the stack turns on because the charge of capacitive load is lagging and therefore drawing as much charge from the neighboring nodes as possible. This charge depletion offsets the balance across the FETs since the resistance of the switching devices limits the current flow to the output. However, adding a capacitor across the nearest FET to the output (on the order of 1:50 actuator to added capacitor) solves the problem for these devices and switch speed since the capacitors will not let voltages change as quickly. When combining this corrective factor and the already existing parallel capacitors, all the capacitors in parallel with the FETs are the same value in order to keep the voltage sharing equal across the devices.

Detent Structure

Figure 9:
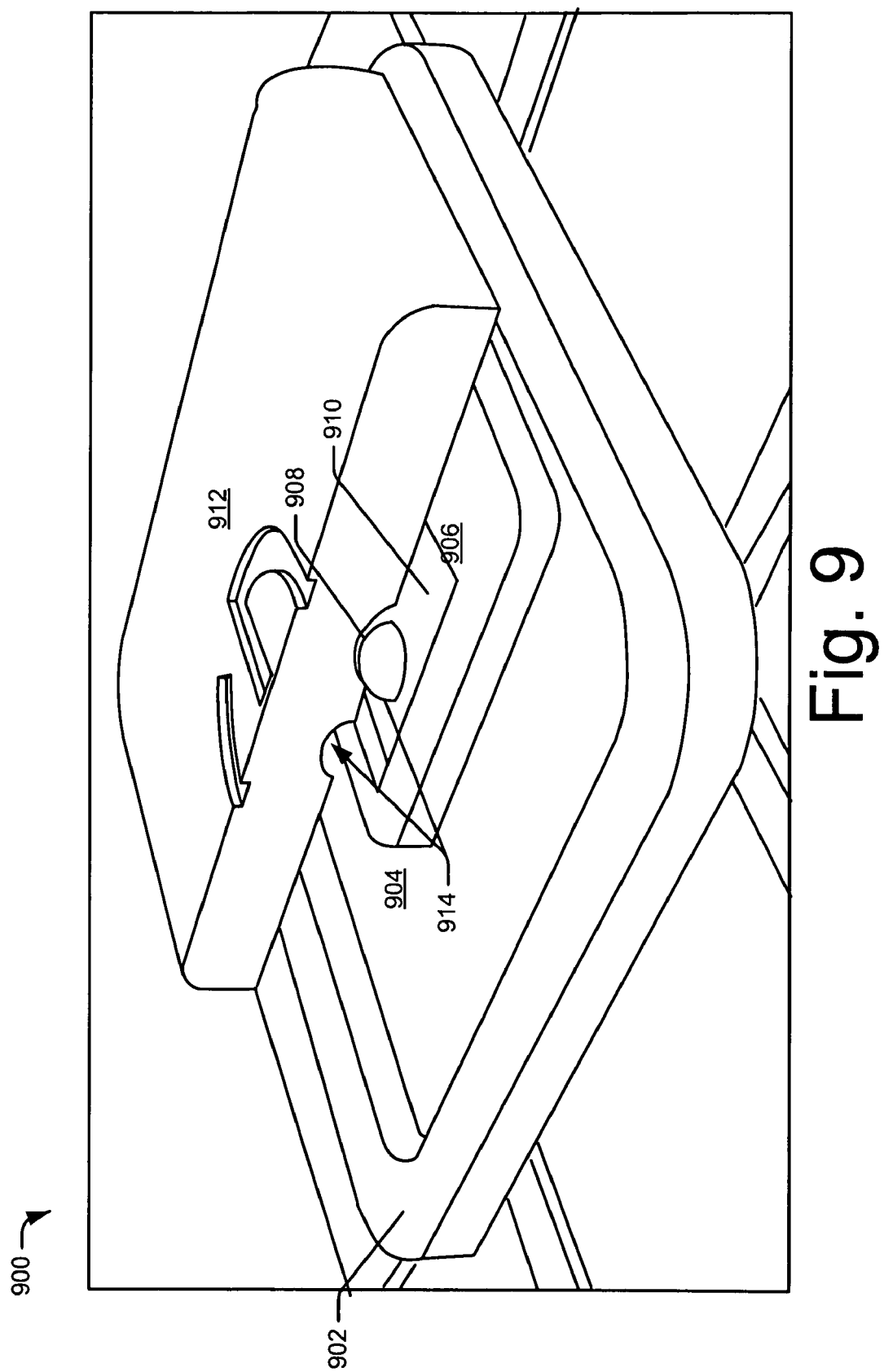
FIG. 9 illustrates a key or keyboard element in accordance with one or more embodiments.

In at least some embodiments, a detent structure can be utilized to impart a snapover effect when the user depresses a key or keyboard element. Any suitable detent structure can be utilized. As an example, consider FIG. 9.

There, a key or keyboard element is shown generally at 900. A frame 902 supports electrically-deformable material 904. A detent structure 906 includes a knob 908 which is supported by a flange 910 which acts as a spring. User-engageable portion 912 includes a pair of concave indentations 914. In this example, when the electrically-deformable material is driven by a voltage, it moves detent structure 906 causing knob 908 to ride into and out of the concave indentations 914 underneath the user engageable portion 912. As engagement and disengagement occurs between knob 908 and the concave indentations 914, a change in velocity takes place which is translated to the top surface of user engageable portion 912. This, in turn, provides haptic tactile feedback to a user's finger.

Example System

Figure 10:
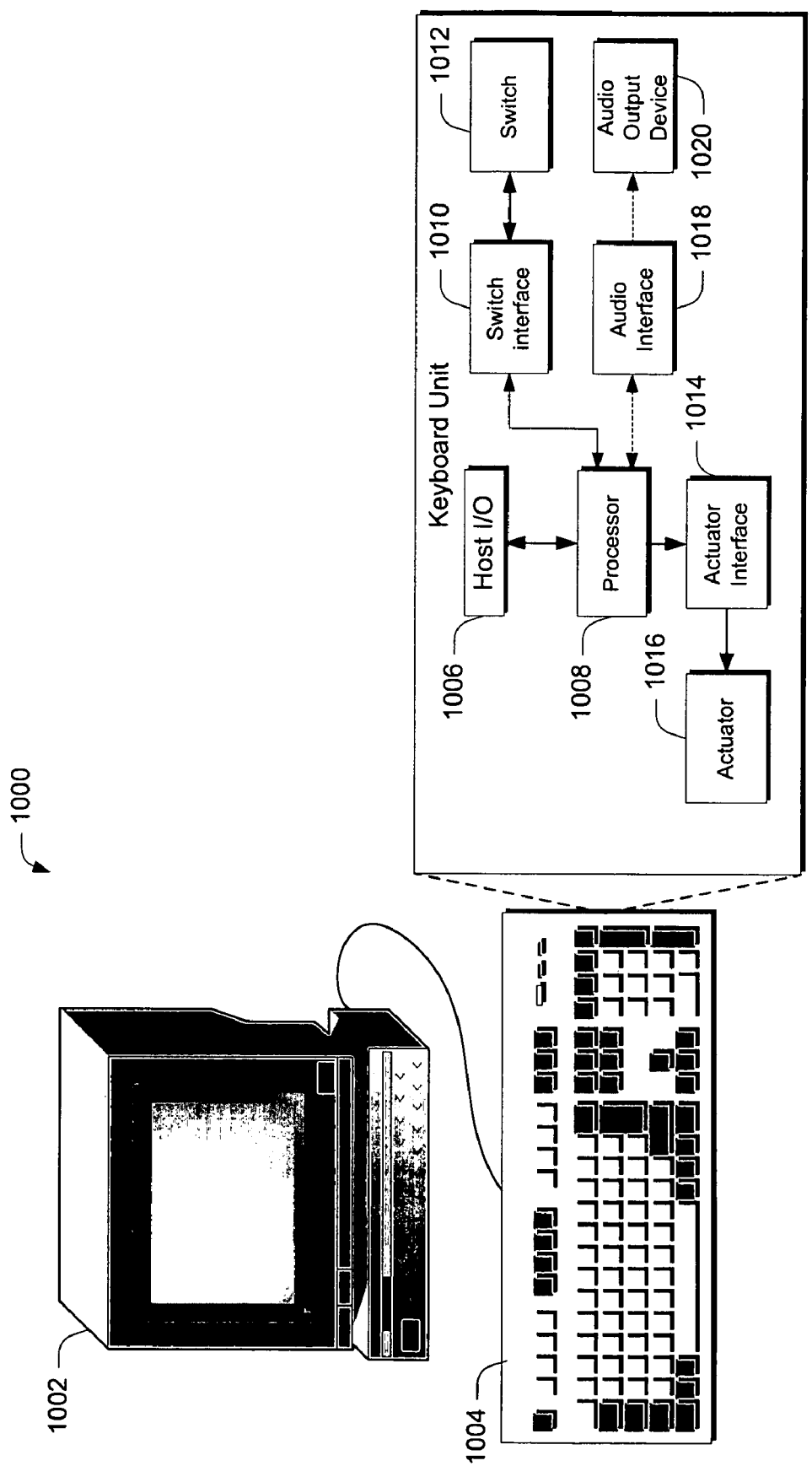
FIG. 10 illustrates a system in accordance with one or more embodiments.

FIG. 10 illustrates an example system in accordance with one embodiment generally at 1000. System 1000 includes, in this example, a computing device 1002 and a keyboard unit 1004. Computing device 1002 can include any suitable computing device such as a desktop computing device, laptop computer, notebook computer and the like.

Keyboard unit 1004 includes, in this example, a host input/output module 1006 which enables communication between computing device 1002 and keyboard unit 1004. Any suitable module can be used examples of which include, by way of example and not limitation, Universal Serial Bus (USB) modules, Bluetooth modules, RS232, PS2, CAN, TCPIP, and the like. Keyboard unit 1004 further includes a microprocessor 1008, a switch interface 1010, a switch 1012, an actuator interface 1014, an actuator 1016, and, optionally, an audio interface 1018 and an audio output device 1020. These various components can be implemented in connection with any suitable hardware, software, firmware or combination thereof. In at least some embodiments, components of the keyboard unit can be implemented as an application specific integrated circuit or ASIC.

In operation, switch 1012 is configured to sense when a particular key or keyboard element is depressed. One example of such a switch is switch closure elements 204, 206 in FIG. 2. Of course, other switch arrangements can be utilized without departing from the spirit and scope of the claimed subject matter, examples of which are provided above. Switch interface 1010 notifies microprocessor 1008 when a depression event has occurred. Microprocessor 1008 controls actuator interface 1014, which can include the above-mentioned drive electronics, effective to cause the drive electronics to apply a drive voltage(s) to actuator 1016. Actuator interface 1014 can be implemented in connection with any suitable hardware, software, firmware, or combination thereof. In this example, actuator 1016 includes both the electrically-deformable material, as well as the physical structure that is mounted to a key or keyboard element.

As noted above, the drive electronics can be used to drive the electrically-deformable material in any suitable way to achieve any suitable movement. In at least some embodiments, the drive electronics are utilized to drive the electrically-deformable material in a manner that imparts multi-vectored movement to the material and hence, to the key or keyboard element with which it is associated. In a specific implementation, this multi-vectored movement comprises a first movement in a first direction, and then a second movement in a second different direction. Of course, other movements and various other directions can be used without departing from the spirit and scope of the claimed subject matter.

Optionally, keyboard unit 1004 can include an audio interface 1018 and an associated audio output device 1020. In at least some embodiments, audio interface 1018 is in communication with microprocessor 1008 and can be configured to produce sounds associated with key or keyboard element depression events. For example, in at least some embodiments, sound recordings of key depressions can be saved and used by the audio interface 1018 to produce, via audio output device 1020, a key depression sound when the key is depressed by the user.

Logical Key Groupings

In at least some embodiments, multiple keys or keyboard elements can be grouped together into a logical grouping which is driven in a multi-vectored manner to provide haptic feedback to a user. In this instance, each logical grouping constitutes a plate which is moved under the influence of the electrically-deformable material. In at least some embodiments, a keyboard can have single keys or keyboard elements that are driven under the influence of the electrically-deformable material, as well as logical groupings of keys or keyboard elements that are driven under the influence of the electrically-deformable material.

Figure 11:
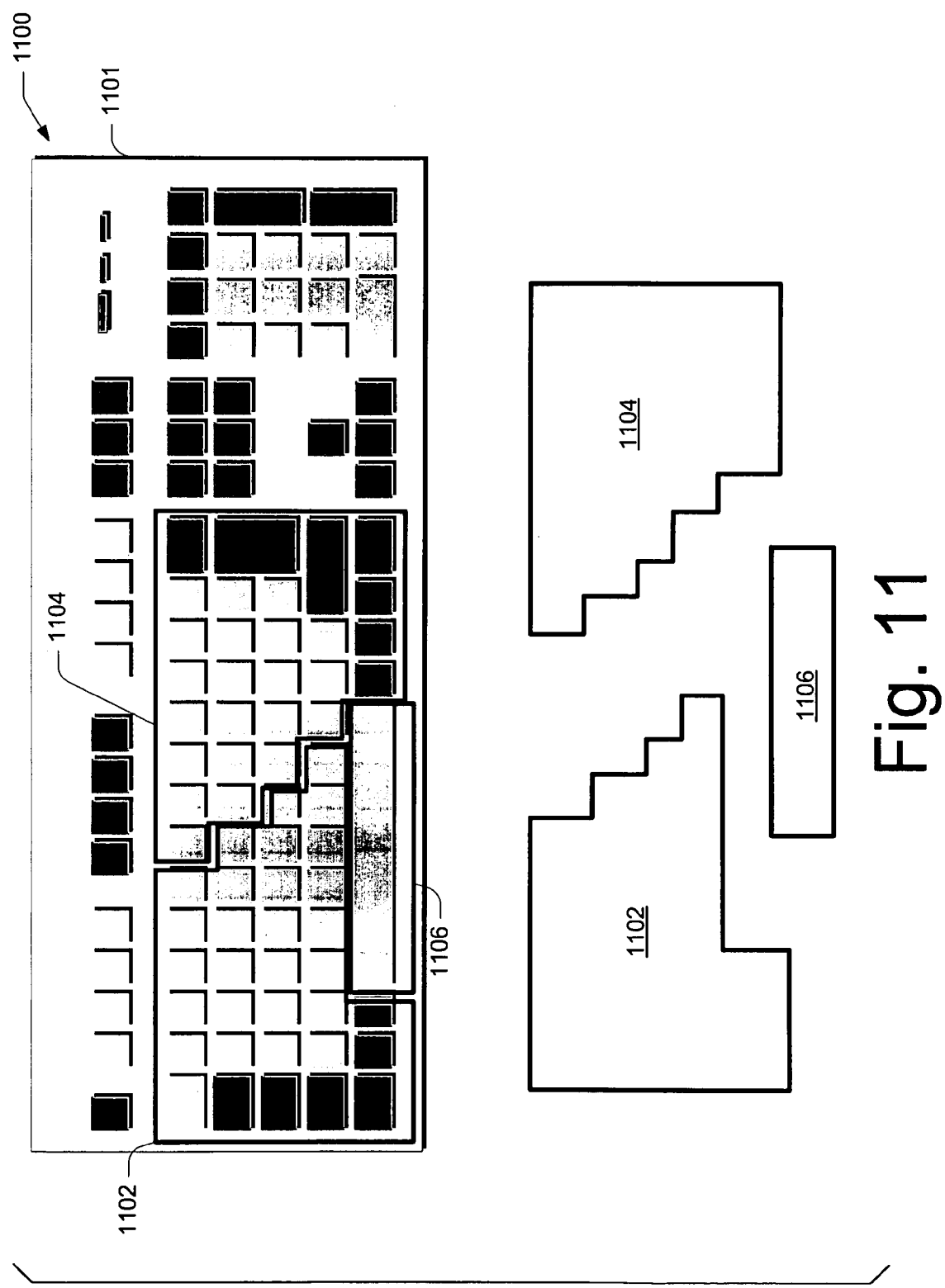
FIG. 11 illustrates an example keyboard in accordance with one or more embodiments.

As an example, consider FIG. 11. There, an example keyboard, in accordance with one or more embodiments, is shown generally at 1100. In this example, a keyboard housing 1101 contains or otherwise supports a plurality of keys. Some of the individual keys are grouped into two logical groupings 1102, 1104. These logical groupings define plates that are each moved in a multi-vectored manner as described above. In addition, a plate 1106 includes the space bar key and is separately driven by its own actuator. For clarity, the individual logical groupings are represented both superimposed on the illustrated keyboard and separately underneath the keyboard. It is to be appreciated and understood that in at least some embodiments, when individual keys or key groupings are moved, the overall housing that supports the keys is not moved. Effectively then, the systems described above can, in at least some embodiments, provide for discrete individual movement of keys or key groupings without moving the corresponding housing.

It is to be appreciated and understood that any suitable grouping of keys or keyboard elements can be used. In this particular example, the logical grouping of keys corresponds to those keys that are typically used by the right hand, and those keys that are typically used by the left hand. Of course, other logical key groupings can be used without departing from the spirit and scope of the claimed subject matter.

Example Method

Figure 12:
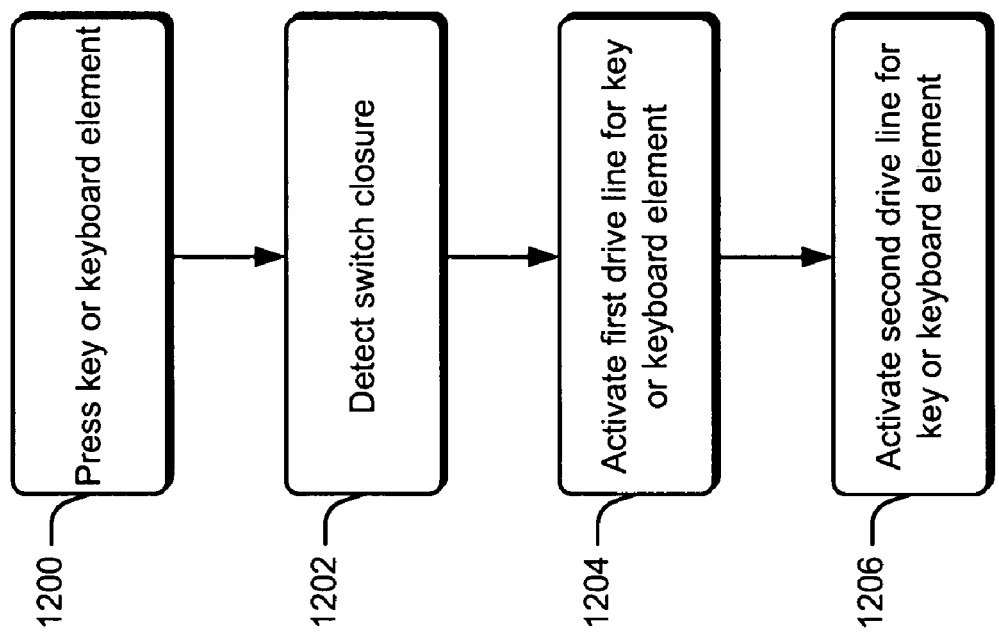
FIG. 12 is a flow diagram that describes steps in a method in accordance with one or more embodiments.

FIG. 12 is a flow diagram that describes steps a method in accordance with one embodiment. The method can be implemented in connection with any suitable hardware, software, firmware or combination thereof. In at least some embodiments, the method can be implemented by a system, such as those systems shown and described above. It is to be appreciated and understood that the described method can be implemented by systems other than those described above without departing from the spirit and scope of the claimed subject matter.

Step 1200 presses a key or keyboard element. This step is typically performed by a user. Step 1202 detects an associated switch closure. In the illustrated and described embodiments, a switch associated with a depressed key is utilized to ascertain when the key has been depressed. One specific example of how this can be done is provided above. Of course, other ways of sensing or detecting a switch closure can be used without departing from the spirit and scope of the claimed subject matter.

Responsive to detecting a switch closure at 1202, step 1204 activates a first drive line for the associated key or key board element. In one or more embodiments, the drive line is connected to an electrically-deformable material as described above. Activating the first drive line causes the electrically-deformable material to deform and hence, move the associated key in a first direction. Step 1206 activates a second drive line for the associated key or keyboard element. Again, this drive line is connected to the electrically-deformable material as described above. Activating the second drive line causes the electrically-deformable material to deform and hence, move the associated key in a second different direction. In the example above, the first and second directions are generally opposite of one another. In addition, the direction of movement is generally orthogonal to the direction of force applied by the user to depress the key. In this manner, the electrically-deformable material can be electrically driven to impart a multi-vectored movement to the key or keyboard element. As pointed out above, however, other directions of movements can be used without departing from the spirit and scope of the claimed subject matter. For example, a particular key may be driven in three or more directions to impart a desired haptic response.

Various embodiments can enable keyboards to provide a desired haptic response, yet be designed to embody a smaller form factor than those typically designed using rubber dome technology. In accordance with one or more embodiments, form factors of the switch, EAP and keytop can be designed as follows. It is to be appreciated and understood that the described form factors constitutes examples of one embodiment. As such, other form factors can be used without departing from the spirit and scope of the claimed subject matter. The described form factors refer to the vertical thickness of the identified elements, for example, as viewed in FIG. 2.

|  | Upper (about) | Range (between about) | Implementation (about) |
|---|---|---|---|
| Switch | .50 mm | .0508 mm-.50 mm | .2286 mm |
| EAP | 2.00 mm | .0175 mm-2.00 mm | 1.00 mm |
| Keytop | 1.50 mm | .254 mm-1.50 mm | .508 mm |
| Totals | 4.00 mm | .3223 mm-4.00 mm | 1.7366 mm |

Backlighting

As noted above, in the past backlighting keyboards has proven difficult due to the presence of various dome and scissor actuating mechanisms. These mechanisms tend to block light and contribute to the vertical thickness and travel distance of traditional keys or keyboard elements—typically from between 2-4 millimeters. As a result, much of the light emitted from a light source beneath these keys or keyboard elements is blocked and/or diffused and thus prevented from reaching and illuminating the top surface. As such, a considerable amount of light, and thus energy, is typically needed to produce even a modest amount of top surface illumination. This is inefficient and results in a less satisfactory backlighting effect.

With keys or keyboard elements implemented according to one or more of the described embodiments, traditional dome and scissor actuating mechanisms can be avoided by utilizing an electrically-deformable material, such as an EAP for example, as an actuating mechanism. This allows for thinner keys or keyboard elements having a smaller vertical thickness, fewer light blocking/diffusing structures and less travel distance. As a result, a light source beneath such keys or keyboard elements can be positioned relatively close to the top surface. Naturally, this reduces the amount of emitted light that is blocked and/or diffused before reaching and illuminating the top surface. Hence, a more satisfactory backlighting effect can be achieved using less illumination, and thus energy, than traditional keys or keyboard elements.

In addition, in at least some embodiments, an electrically-deformable material that is generally translucent can be utilized. This further enhances the backlighting effect by further reducing the amount of emitted light that is blocked and/or diffused before reaching the top surface.

Figure 13:
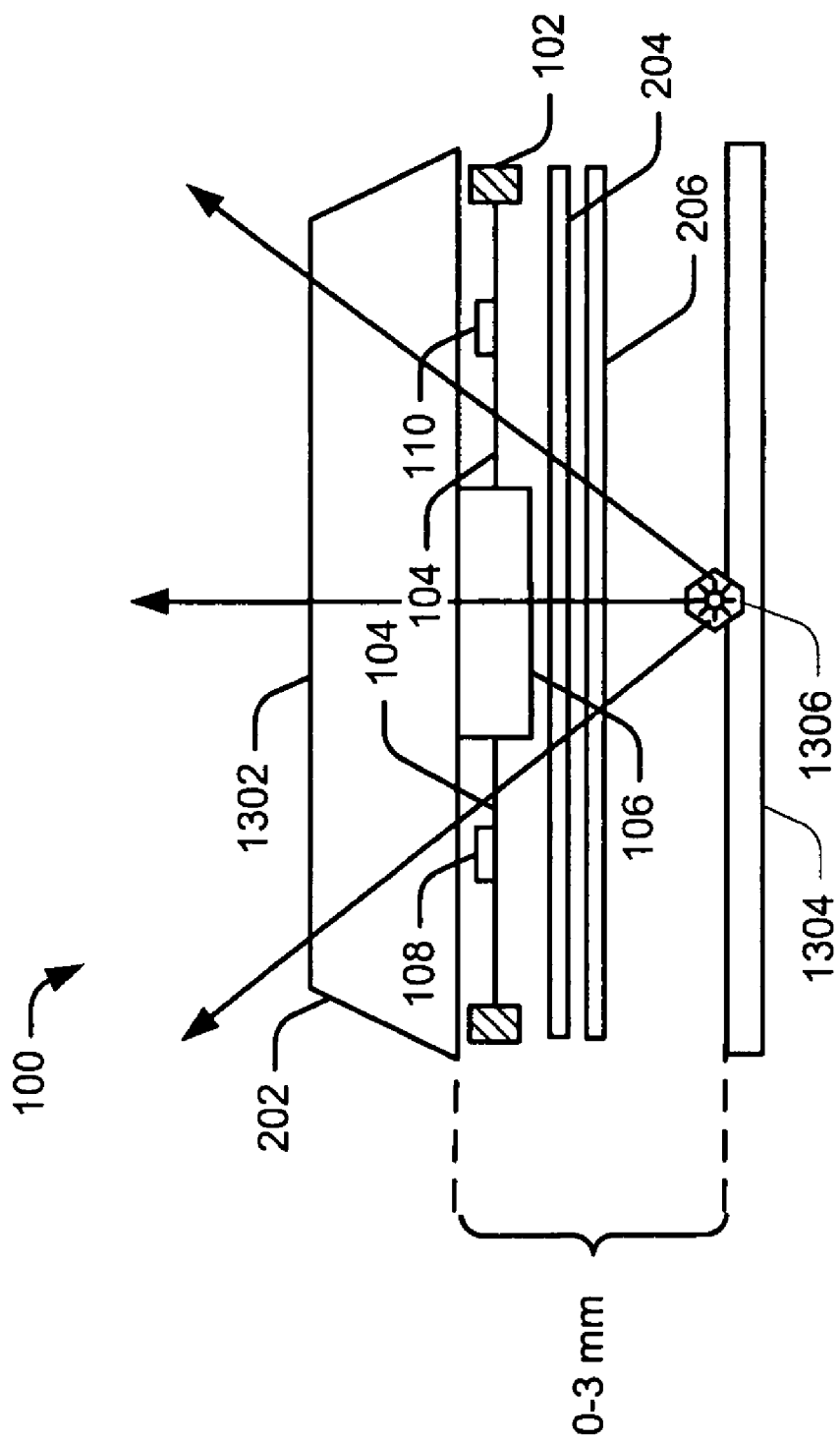
FIG. 13 illustrates a key or keyboard element in accordance with one or more embodiments.

As an example, consider FIG. 13. There, key or keyboard element 100 is illustrated with like numerals from FIGS. 1 and 2 depicting like components. Key or keyboard element 100 includes user-engageable portion 202, which in turn includes a visible top surface 1302. Key or keyboard element 100 is associated with an underlying surface 1304 on which a light source 1306 is mounted or otherwise positioned. Light source 1306 can be implemented using any suitable technology. By way of example and not limitation, light source 1306 can be implemented using LEDs, light pipes using LEDs, fiber optic mats, and/or electroluminescent panels to name just a few. Key or keyboard element 100 can be associated with underlying surface 1304 in any suitable way. For example, underlying surface 1304 can be part of key or keyboard element 100. Alternatively or additionally, underlying surface 1304 can be part of another structure, such as a keyboard housing which contains or otherwise supports key or keyboard element 100. Underlying surface 1304 can be any suitable type of surface, such as a printed silicon circuit for instance.

Located between top surface 1302 and underlying surface 1304 are various key or key element structures described above, including electrically-deformable material 104 which can be employed as an actuating mechanism. As noted above, this allows key or keyboard element 100 to be thinner than traditional keys or keyboard elements and to be associated with less travel distance. In this example, key or keyboard element 100 is shown as being associated with a travel distance of between 0 millimeters to about 3 millimeters. As a result, light source 1306 can be positioned relatively close to top surface 1302. This significantly reduces the amount of emitted light that is blocked and/or diffused before reaching the top surface. Hence, a more satisfactory and efficient backlighting effect on top surface 1302 can be achieved. Additionally, as noted above, this backlighting effect can be further enhanced by utilizing an electrically-deformable material that is generally translucent.

Selective Backlighting

In at least some embodiments, selective backlighting can be employed. The close proximity of an underlying light source to the top surface of the key or keyboard element allows underlying light to be emitted in a controlled fashion relative to a specific portion or portions of a keyboard. A keyboard portion can include, by way of example and not limitation, all of the keyboard keys, a subset of less than all of the keys, an individual key and/or a sub-region of the top surface of an individual key. Any or all of these keyboard portions can thus be selectively backlit by the underlying light source.

Figure 14:
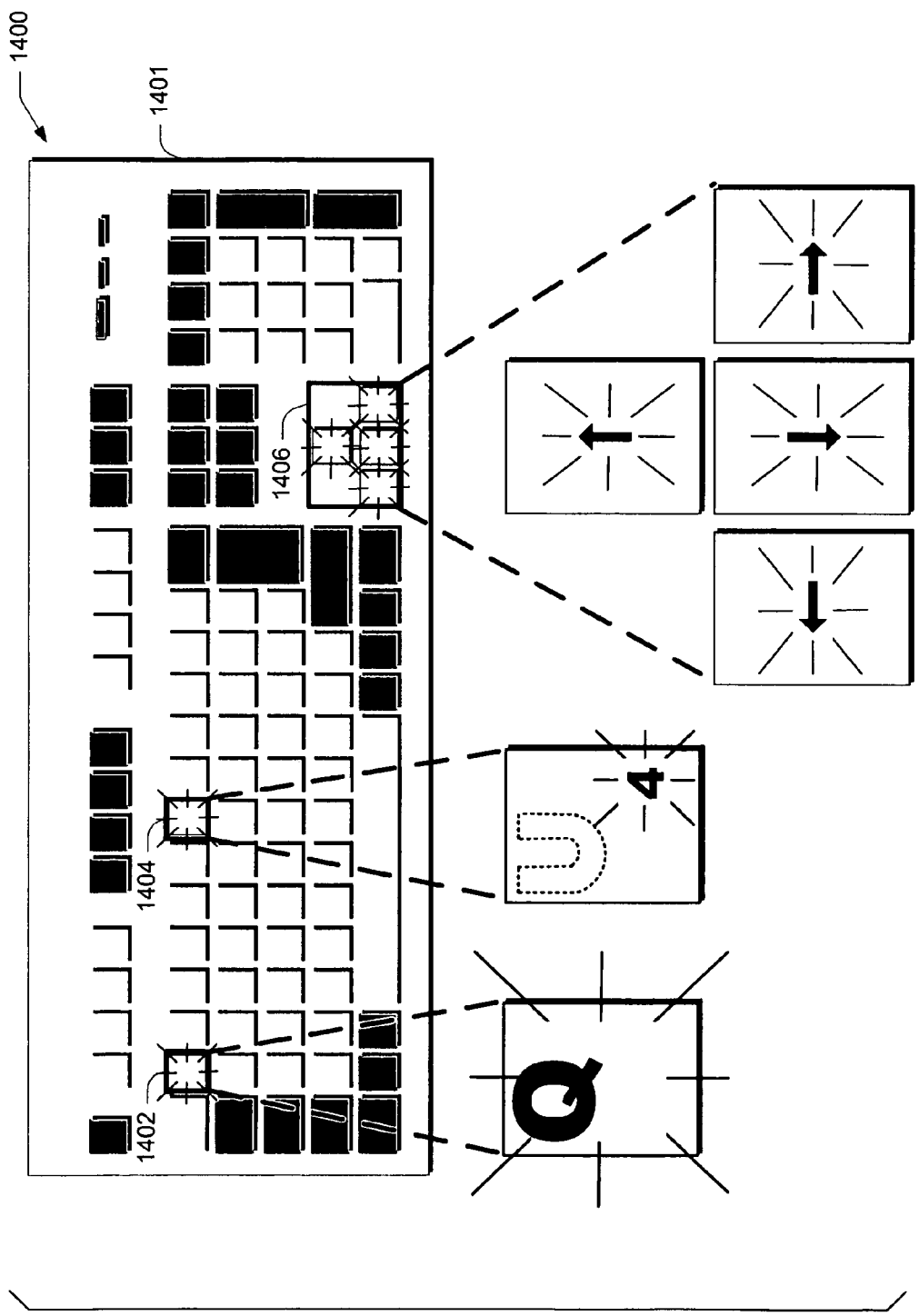
FIG. 14 illustrates an example keyboard in accordance with one or more embodiments.

As an example, consider FIG. 14 which illustrates several examples of selective backlighting. There, an example keyboard is shown generally at 1400. Keyboard 1400 includes a keyboard housing 1401 which contains or otherwise supports a plurality of keys or keyboard elements such that one or more light sources (not shown) are positioned relatively close to and beneath the visible top surface region of at least some of the keys. Any suitable light source(s) can be utilized such as, without limitation, an electroluminescent light source(s) for instance.

As an example of selective backlighting, note that the entire top surface of key 1402 is illuminated. In contrast, the top surfaces of other keys immediately surrounding and adjacent key 1402 are not illuminated. As such, key 1402 has been selectively backlit. Key 1402 can be selectively backlit in response to any suitable input. Similarly, the selective backlighting of key 1402 can be terminated in response to any suitable input as well. By way of example and not limitation, key 1402 can be selectively backlit in response to receiving an input resulting from a user depressing a key or keys of keyboard 1400. Alternatively or additionally, key 1402 can be selectively backlit in response to receiving an input from an application implemented on a device communicatively linked to keyboard 1400, such as computing device 1002 in FIG. 10. Consider a scenario, for instance, where a user desires key 1402 to be backlit to distinguish it from other surrounding keys so that it can be easily located. To accomplish this, the user may depress key 1402 and/or another key(s) of keyboard 1400.

As another example of selective backlighting, note that only a sub-region of the entire top surface region of key 1404 is illuminated. More particularly, only the sub-region that includes the number "4" is illuminated. This illuminated region makes up less than the entire top surface region of key 1404. Other sub-regions of the top surface, including the sub-region that includes the letter "U", are not illuminated. As such, only the top surface sub-region that includes the number "4" has been selectively backlit. As will be appreciated by the skilled artisan, this can be accomplished by employing a suitable key structure such as, without limitation, a key structure that includes a segmented electroluminescent display panel. As with key 1402 described above, the sub-region of key 1404 can be backlit in response to any suitable input. Similarly, this backlighting can be terminated in response to any suitable input as well. Consider a scenario, for instance, where the user depresses a "number lock" key and/or another key(s) of keyboard 1400, causing key 1404 to be programmed such that when it is depressed, the number "4" rather than the letter "U" is inputted. To indicate this, an input responsive to the depressed key(s) can be sent instructing only the sub-region of key 1404 including the number "4" to be backlit such that the number "4" is emphasized as the active function for this key.

As a third example of selective backlighting, note that individual keys in key subset 1406 are illuminated. More particularly, all or a portion of the top surface regions of these keys, including their respective directional arrows, are illuminated. In this regard, the keys surrounding key subset 1406 are not illuminated. As such, key subset 1406 has been selectively backlit. As with keys 1402 and 1404 above, key subset 1406 can be backlit in response to any suitable input. Similarly, this backlighting can be terminated in response to any suitable input as well. Consider a scenario, for instance, where the user is able to interact with an application, such as a game, by depressing one or more individual keys of key subset 1406. To distinguish these individual keys so that they can be easily located, an input can be sent by the application instructing key subset 1406 to be backlit.

Example Backlighting Method

FIG. 15 is a flow diagram that describes steps of a method in accordance with one embodiment. The method can be implemented in connection with any suitable hardware, software, firmware or combination thereof. In at least some embodiments, the method can be implemented by a system, such as those systems shown and described above. It is to be appreciated and understood that the described method can be implemented by systems other than those described above without departing from the spirit and scope of the claimed subject matter.

Step 1500 receives an input associated with illuminating a portion of a keyboard. As pointed out above, any suitable input can be received, such as an input responsive to a user depressing a key(s) and/or an input received from an application for example. Responsive to receiving the input at step 1500, step 1502 illuminates the keyboard portion. This can include illuminating all of the keyboard keys, a subset of the keys, an individual key and/or a sub-region(s) of an individual key. This step can be facilitated by electronic circuitry, firmware and/or software that resides in the keyboard. For example, this step can be performed under the influence of a processor, such as the one shown and described above in FIG. 10.

Step 1504 receives an input associated with terminating illumination of the keyboard portion. Similar to above, any suitable input can be received. Responsive to receiving the input at step 1504, step 1506 terminates illumination of the keyboard portion. Again, this step can be facilitated by electronic circuitry, firmware and/or software that resides in the keyboard. For example, this step can be performed under the influence of a processor, such as the one shown and described above in FIG. 10.

CONCLUSION

Various embodiments provide keyboards that utilize an electrically-deformable material as an actuating mechanism to provide haptic feedback to a user of the keyboard. In at least some embodiments, the electrically-deformable material is utilized to impart, to a depressed key or keyboard element, a multi-vectored movement that produces a perceived acceleration of the key or keyboard element thus providing a user with haptic feedback which simulates a snapover movement.

In at least some embodiments, the electrically-deformable material is driven with a voltage responsive to a user depressing a key or keyboard element. In these embodiments, switch closure is first attained followed by the haptic feedback provided through the multi-vectored movement of the key or keyboard element. In at least some embodiments, the multi-vectored movement moves the key or keyboard element in at least a first direction, and then a second direction which is different from the first. Each of the directional movements is induced by its own driven voltage which is applied to different areas of the electrically-deformable material. In at least some embodiments, one of the directions of movement moves the key or keyboard element a distance which is greater than another of the directions of movement.

In a specific embodiment, a first direction of movement is generally toward the user and a second direction of movement is generally away from the user. In at least some embodiments, the first direction moves the key or keyboard element a distance which is less than a distance that the second direction moves the key or keyboard element. In one embodiment, the first direction moves the key or keyboard element a distance which is about half the distance that the second direction moves the key or keyboard element.

In at least some embodiments, multiple keys or keyboard elements can be grouped together into a logical grouping which is driven in a multi-vectored movement to provide haptic feedback. In this instance, each logical grouping constitutes a plate which is moved under the influence of the electrically-deformable material. In at least some embodiments, a keyboard can have single keys or keyboard elements that are driven under the influence of the electrically-deformable material, as well as logical groupings of keys or keyboard elements that are driven under the influence of the electrically-deformable material.

In at least some embodiments, the electrically-deformable material comprises an electroactive polymer or EAP. Other electrically-deformable materials can, of course, be used.

In at least some embodiments, a light source can be mounted or otherwise positioned relatively close to and beneath the top surface of one or more keys or keyboard elements. As a result, the amount of emitted light that is blocked and/or diffused before reaching and illuminating the top surface is significantly reduced.

In at least some embodiments, a specific portion of a keyboard can be selectively illuminated to achieve a tailored backlighting effect.

In at least some embodiments, an input associated with illuminating a keyboard portion can be received. In response to receiving this input, the keyboard portion can be illuminated. In addition, an input associated with terminating the illumination of the keyboard portion can be received. In response to receiving this input, the illumination of the keyboard portion can be terminated.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A keyboard comprising:
   a plurality of separately movable keys positioned on the keyboard, each of one or more of the plurality of keys have operatively associated therewith:
   a user-engageable top surface; and
   an actuation mechanism positioned thereunder its associated key, wherein the actuation mechanism is configured to:
   provide haptic feedback to a user engaging the user-engageable top surface of its associated key, and facilitate light transmission therethrough the actuation mechanism and to its associated key, and the actuation mechanism includes an electrically-deformable material configured to actuate its associated key; and a light source positioned beneath at least a portion of the top surface of at least some of the plurality of keys and configured to backlight one or more of the plurality of keys by light from the light source passing through at least a portion of the top surface of the one or more backlit keys.

2. The keyboard of claim 1, wherein the electrically-deformable material comprises an electroactive polymer (EAP).

3. The keyboard of claim 1, wherein the electrically-deformable material is translucent.

4. The keyboard of claim 1, wherein the light source is positioned beneath at least part of the electrically-deformable material.

5. The keyboard of claim 1, wherein the light source comprises an electroluminescent light source.

6. The keyboard of claim 1, wherein individual keys of the plurality of keys are associated with a travel distance of between 0 millimeters to about 3 millimeters.

7. The keyboard of claim 1, wherein the light source is further configured to backlight only a sub-region of an individual key of the plurality of keys.

8. A keyboard comprising:
at least one key positioned on the keyboard;
an actuating mechanism, associated with the keys, the actuating mechanism being configured to actuate the key using structures that enable the transmission of light to underneath the key; and
a light source positioned to illuminate the key.

9. The keyboard of claim 8, wherein the structures of the actuating mechanism that actuate the key are characterized by their properties that encourage non-diffusion of light and non-blocking of light emanating from underneath the key.

10. The keyboard of claim 8, wherein the actuating mechanism comprises an electrically-deformable material.

11. The keyboard of claim 10, wherein the electrically-deformable material comprises an electroactive polymer (EAP).

12. The keyboard of claim 10, wherein the electrically-deformable material is translucent.

13. The keyboard of claim 8, wherein at least part of the actuating mechanism is positioned between the light source and the one or more individual keys or keyboard elements.

14. The keyboard of claim 8, wherein the light source is configured to illuminate only a sub-region of an individual key or keyboard element of the plurality of keys or keyboard elements.

15. A keyboard comprising:
a plurality of separately movable keys positioned on the keyboard, each of one or more of the plurality of keys have operatively associated therewith;
a user-engageable top surface; and
an actuation mechanism positioned thereunder its associated key, wherein the actuation mechanism is configured to:
provide haptic feedback to a user engaging the user-engageable top surface of its associated key, and
facilitate light transmission therethrough the actuation mechanism and to its associated key, and
the actuation mechanism includes an electrically-deformable material configured to actuate its associated key; and
at least one light source positioned beneath at least a portion of the top surface of at least one of the plurality of keys and configured to backlight one or more of the plurality of keys by light from the light source passing through at least a portion of the top surface of the one or more backlit keys, wherein only a sub-region of the top surface of at least one individual key has light from the light source passing therethrough.

16. The keyboard of claim 15, wherein the electrically-deformable material comprises an electroactive polymer (EAP).

17. The keyboard of claim 15, wherein the electrically-deformable material is translucent.

18. The keyboard of claim 15, wherein the at least one light source is positioned beneath at least part of the electrically-deformable material.

19. The keyboard of claim 15, wherein the at least one light source comprises an electroluminescent light source.

20. The keyboard of claim 15, wherein individual keys of the plurality of keys are associated with a travel distance of between 0 millimeters to about 3 millimeters.

* * * * *